(12) United States Patent
Robson et al.

(10) Patent No.: US 7,111,257 B2
(45) Date of Patent: Sep. 19, 2006

(54) USING A PARTIAL METAL LEVEL MASK FOR EARLY TEST RESULTS

(75) Inventors: Norman W. Robson, Hopewell Junction, NY (US); Teresa J. Wu, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 305 days.

(21) Appl. No.: 10/605,169

(22) Filed: Sep. 12, 2003

(65) Prior Publication Data

US 2005/0060681 A1     Mar. 17, 2005

(51) Int. Cl.
*G06F 17/50* (2006.01)
(52) U.S. Cl. ........................................ 716/4
(58) Field of Classification Search ............... 716/4, 716/19–21, 5; 714/25; 702/108, 117–121
See application file for complete search history.

(56) References Cited

U.S. PATENT DOCUMENTS

| | | | | |
|---|---|---|---|---|
| 4,924,589 A | * | 5/1990 | Leedy | 438/6 |
| 5,103,557 A | * | 4/1992 | Leedy | 438/6 |
| 5,225,771 A | * | 7/1993 | Leedy | 324/757 |
| 5,512,397 A | * | 4/1996 | Leedy | 430/30 |
| 5,629,137 A | * | 5/1997 | Leedy | 430/313 |
| 5,654,127 A | * | 8/1997 | Leedy | 430/315 |
| 5,707,881 A | * | 1/1998 | Lum | 438/15 |
| 5,725,995 A | * | 3/1998 | Leedy | 430/315 |
| 5,959,462 A | * | 9/1999 | Lum | 324/765 |
| 6,281,696 B1 | * | 8/2001 | Voogel | 324/765 |
| 6,562,639 B1 | * | 5/2003 | Minvielle et al. | 438/14 |

* cited by examiner

*Primary Examiner*—Jack Chiang
*Assistant Examiner*—Nghia M. Doan
(74) *Attorney, Agent, or Firm*—Eric Petraske

(57) ABSTRACT

A method of using special designed wiring level mask(s) to determine product transistor and circuit performance in a chip during the early portion of the product evaluation cycle saves weeks of time that would have been taken by the passage of the wafer through the fab. The method also saves cost during production by identifying wafers for rework at an early stage.

9 Claims, 4 Drawing Sheets

USING A PARTIAL METAL LEVEL MASK FOR EARLY TEST RESULTS

BACKGROUND OF INVENTION

The field of the invention is that of integrated circuits, in particular fabricating circuits with design changes.

In the course of developing an integrated circuit, the designers make use of extensive computer models that predict the electrical performance of a circuit that has been synthesized, e.g. in a computer program that accepts as input the logic requirements of a system and generates a schematic that performs the functions specified.

Such programs are very sophisticated, but not infallible.

During the logic technology qualification cycle, one of the major hurdles needed to overcome is performance limitations that prevent the system specification from being realized. This becomes more critical with advanced technology.

Numerous process changes and model to hardware correlation are needed to assess the performance specification for the technology. The performance assessment is often made on final product chips with four to six levels of metal. The turn-around-time of this trial and error method to achieve final product performance data is significantly long due to extensive BEOL (Back End Of Line) wiring levels used in the product chip. As we incorporate more device types and move towards System On a Chip (SOC) early readout and correlation of product performance becomes critical. The parametric data does not always match the product performance.

Product chip data at final test are currently correlated back to the inline parametric data taken during the passage of the wafer through the fab. Parametric data is monitored to provide look ahead and indicate whether the hardware heading to product wafer test is healthy and to predict final chip yield. Parametric monitoring has been performed in this way for multiple generations of integrated circuits, providing standard checks on electrical parameters including the transistor characteristics.

However, the reference macro designs on which the parametric data is obtained cannot accommodate all the numerous design/process variables that reflect all transistors in the actual product chip environment. Often, the inevitable differences between the parametric transistor design vs. product transistor design can result in conflicting data. For example, it often happens that the parametric transistor results measured inline meet the design manual specification and yet the product chip performance results do not meet the specification set for the chip.

As performance requirements increase, the margin for error or manufacturing tolerance is reduced, so that a deviation in the performance of an individual device may be magnified by the circuit within which the devices is located. The result may be that the circuit does not meet its specification, even though the device does.

Due to the complex process of fabricating transistors in various environments, it is possible to have different physical shapes for transistors in different environments. It becomes increasingly difficult to maintain transistor shapes constant across the chip with each scaling technology generation. Systematic technology process solutions (across chip solutions) can only resolve this issue to a certain degree.

In particular, across chip line width variation may produce transistors with different amounts of drive in different parts of the chip. This may affect the time when a following device is turned on or off and thus change the circuit timing from its specification. In some cases, there may be logic errors when a signal arrives late or early.

In addition to the foregoing problems that do not depend on the time to pass through the fab significantly, there are other issues that explicitly deal with the time between identification of a problem and implementation of a solution. Often, a performance limiting feature is only identified on fully finished wafers.

In order to identify such problems, the chips often need to be delayered down to a lower level where a FIB (focused ion beam) probe technique is used to evaluate the actual transistor behavior in the questionable circuit. These standard techniques simply consume too many resources and have very long turn-around-time.

For example, the transit time of a wafer through a fab takes several months which the exact turn-around-around time varies depending on specific chip design for Back-End-of-Line build and fab loading, so that it takes a significant amount of time for a test batch of wafers to emerge from the fab so that they can be tested more rigorously than is possible for the in-process testing. Once a problem is identified (and a possible solution found) it then takes a period of months for wafers embodying the solution to make their way through the fab so that tests can be run to confirm that the proposed solution does or does not work.

There are several current methods for assessing performance of the product

1. Actual product performance at speed—This approach needs a final test, and possibly a packaged module. Further, if a problem is seen it can be difficult to correlate the problem with particular devices.

2. The use of test modes (in the testing program) to evaluate parts of the circuit—This approach needs both a final test and also additional circuits on the chip (Silicon area=cost) and design effort.

3. Test points within the design—This approach provides direct access to devices, but also needs access to the first metal (in order to locate the test points) and the design functions require significant bench work and design effort.

4. Chip delayer and Focus Ion Beam (FIB) cutting+wiring of devices within the chip—This approach also needs for the final level to be completed. In addition, we need to know which device is causing a problem. Further, since this is a labor-intensive process, there will be only a small sample size, so that the particular components examined may not be the immediate cause of the problem (even if they contribute to the problem in a large statistical sample). This approach often fails to identify a problem that can be fixed when there is an inconclusive test output.

5. Correlation of parametric data to product performance —This approach also needs test data from the completed chip. It is also not always successful in correlating the circuit problem with the parametric data.

SUMMARY OF INVENTION

The invention relates to a method of testing the performance of an integrated circuit in which one or more circuits has a test interconnect arrangement formed in an early layer of interconnect.

An aspect of the invention is the connection of a subset of transistors in an integrated circuit to form a test structure from that portion of the circuit.

Another aspect of the invention is the connection of a circuit module for testing.

Another aspect of the invention is the formation of a test arrangement by a lithographic process.

Yet another aspect of the invention is the removal of the test arrangement and subsequent formation of a standard interconnect structure.

DETAILED DESCRIPTION

Figure 1:
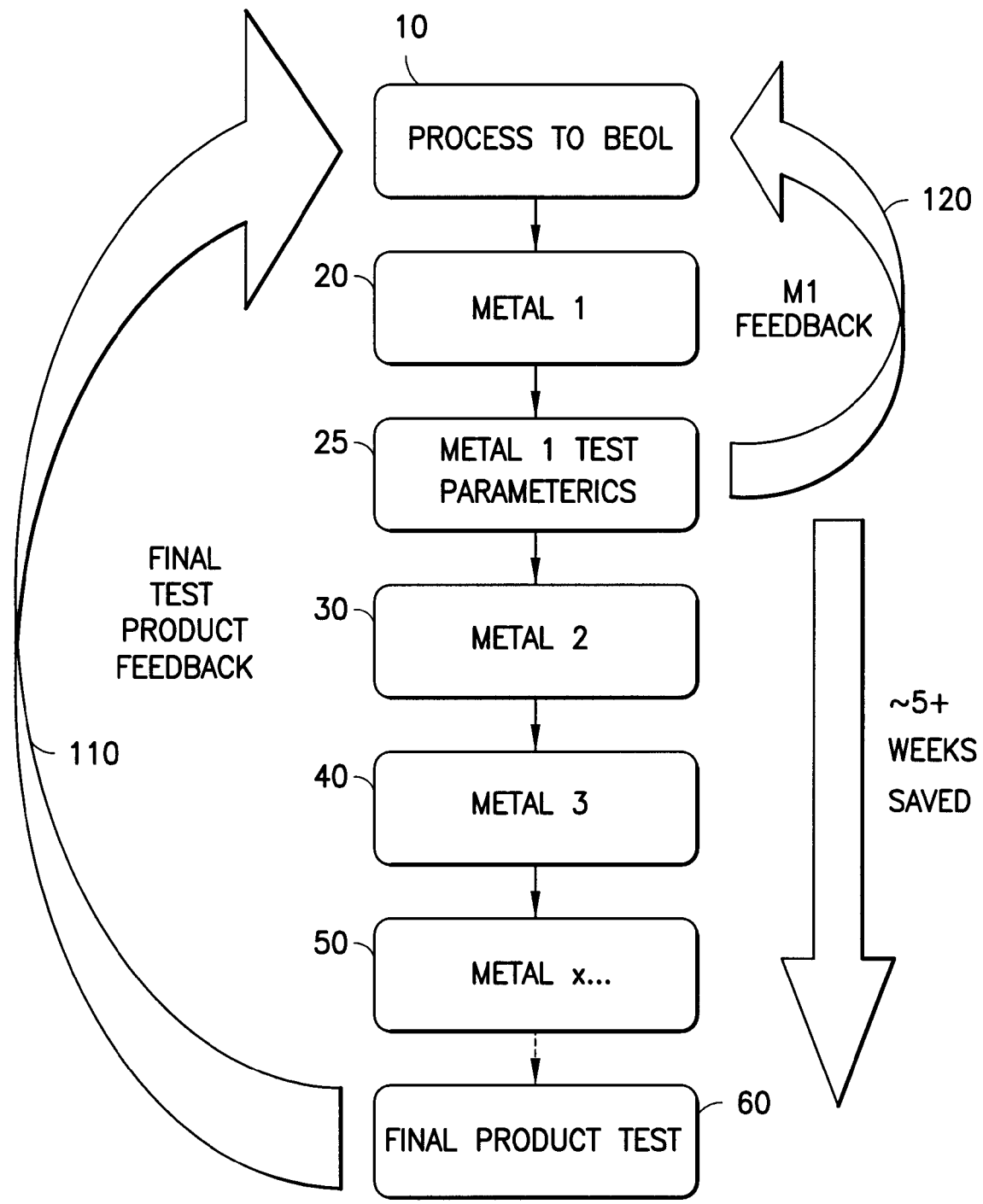
FIG. 1 illustrates the sequence of steps in a fab.

FIG. 1 illustrates in condensed form the progress of a wafer through an integrated circuit facility (fab).

Box 10 represents steps referred to as the front end of the line, in which various operations are performed on the semiconductor substrate. For example, implants to form N- and P- wells in the substrate, threshold implants, isolation structures, such as shallow trench isolation, etc.

Box 20 represents the first level of interconnection (sometimes referred to as interconnect) that forms the electrical circuit by connecting transistors and other circuit components, referred to as "metal 1". Other levels of interconnection are conventionally referred to as "metal 2", etc. The standard metal in the past has been aluminum, which is now being supplemented or replaced by copper. The invention does not depend on the choice of material used for the interconnection.

The first level of metal begins the section of the process referred to as the "back end of the line", or BEOL. Some workers in the field also refer to the middle of the line, meaning the contact studs connecting the transistors and first level metal which in-process testing can take place.

Referring back to FIG. 1, box 25 refers to measuring the parameters of various monitoring structures. Conventionally, integrated circuit wafers have the circuits separated by a space, referred to as the kerf, which is removed during the process of sawing the wafer to separate the circuits before packaging. It is customary to construct test transistors, metal structures, etc in the kerf space. These test structures have contacts suitable to be probed by test equipment. The test structures are tested after various steps to monitor the quality of the various process steps.

For example, test transistors may be measured to check their turn-on voltage, current capacity, etc. In some cases, an error will be found and the particular wafer can be pulled out of the line and reworked by stripping off the defective layer and doing it over. For example, there may have been a misalignment in the second level of metal that causes many chips on the wafer to have a short circuit. Instead of scrapping the wafer, it may be economically feasible to strip off that level of metal and deposit it again.

It will be evident that the sooner a defective process step is detected, the better. Not only will there be less work and risk in removing a single level than in removing several, there will be fewer defective wafers made when the defect is systematic, rather than an error that applies to a single wafer. For example, an alignment error by the operator may affect only a single wafer. An error in the flow rate of a chemical will affect all the wafers passing through the particular machine having that error.

Boxes 30, 40 and 50 denote the formation of metal levels in a process having several layers of metal interconnections.

The term 'electrically complete' or 'electrical completion', will be used to describe chips that have been processed through the last layer of interconnect.

Box 60 denotes the final product test, typically after the wafer has been separated into chips and packaged. It is usually not possible to salvage chips that are identified with defects at this stage, and the only thing that can be done is to change the process and scrap the defective chips.

Arrow 110 in the Figure indicates the standard feedback path in the past, in which the final product test is analyzed to identify which step in the process is faulty and future wafers are processed with a different value of the relevant parameter.

On the right of the Figure, Arrow 120 illustrates the feed-back path according to the invention. In the illustrative embodiment, the test structure comprising transistors, connections, etc. is formed with contacts and interconnects in the first level of metal. If a flaw or a parameter out of specification is detected it is corrected. If correction is not feasible, there will be no need to waste time on that wafer by performing later steps in the process.

The arrow on the lower right side indicates that in a typical fab the time spent between metal 1 and final test is about 5 weeks and in many fabs it is more.

Figure 2:
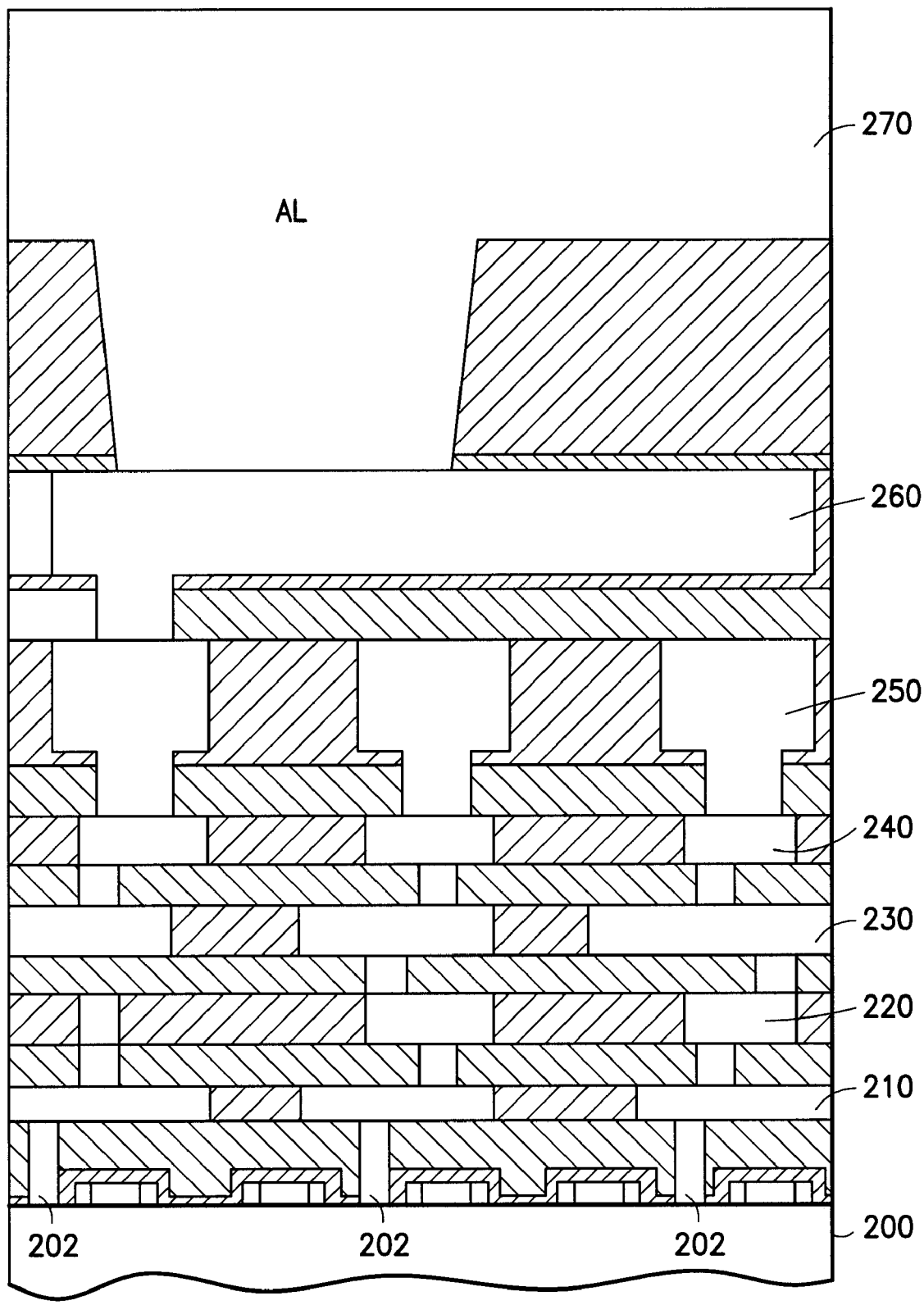
FIG. 2 illustrates in cross section a typical interconnect structure of several layers.

FIG. 2 shows in cross section a typical integrated circuit.

On the bottom, layer 200 represents the semiconductor substrate and a row of rectangles that represent transistors. Vertical lines 202 represent contacts to the sources and drains of the transistors. Contacts to the gates of the transistors are not shown, for simplicity. A layer of dielectric insulates the transistors from one another and from the interconnection members. The deposition process of forming a pattern in photoresist, depositing a layer of metal in the pattern (or of putting down a layer of metal and removing the unwanted portions) will be referred to as a lithographic process in the claims.

Layer 210 represents the first layer of metal, which extends into and out of the plane of the paper to connect various circuit elements, not only the transistors shown, but also resistors, capacitors, diodes etc.

Layer 220 represents the second level of metal, having vertical members, referred to as vias, that connect to the metal 1 layer and horizontal members that form various connections as required by the circuit.

Layer 230, 240, 250 and 260 represent metal 3, metal 4, metal 5 and metal 6, respectively. Layer 270 represents a pad for making contact to the packaging. Pads are conventionally much larger than the lower levels because the packaging contacts can not be aligned as accurately as the lower levels.

Figure 3A:
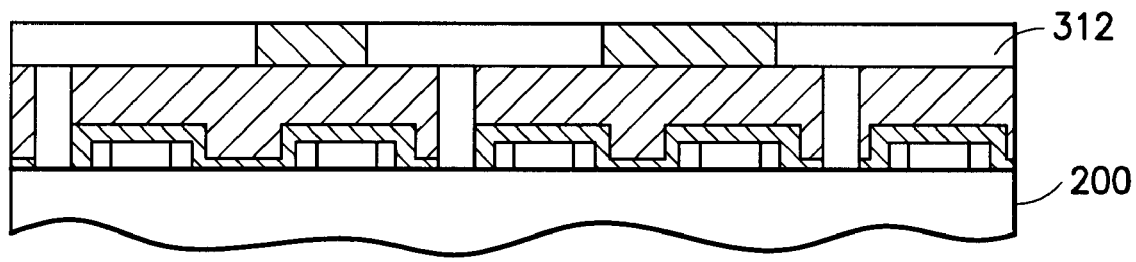
FIG. 3A illustrates an alternative test arrangement.

FIG. 3A shows a cross section of a test interconnect structure according to the invention, in which layer 312 represents a layer in the metal 1 level above the wafer, but is set up to define a test circuit, which may be as small as a single transistor or as large as a multiplier or other large-scale circuit module. The interconnect components, whether metal 1, and/or metal 2 will be referred to as a test interconnect arrangement.

Figure 3B:
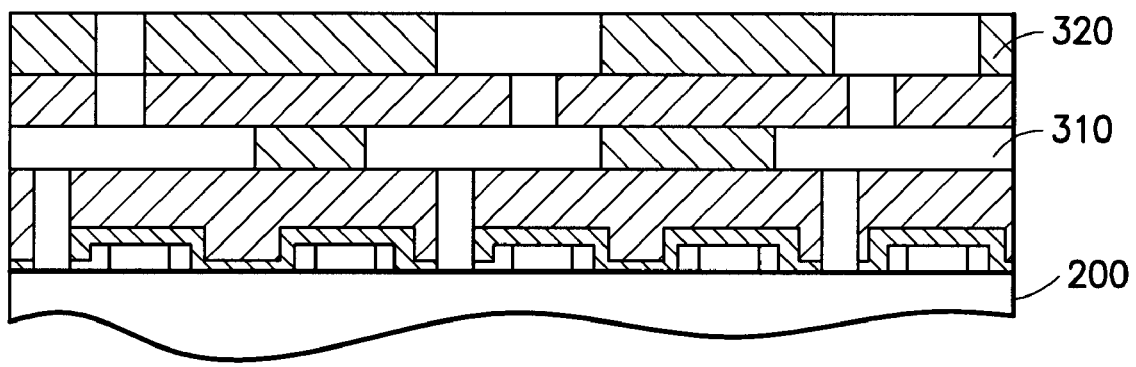
FIG. 3B illustrates an alternative test arrangement using two levels of test interconnect.

FIG. 3B show a similar arrangement to that of FIG. 3A, but in which the test structure uses two levels, denoted 310 and 320. This arrangement would be used for a more complex test circuit that requires two levels to be laid out. The invention is not restricted to two level and various combinations of higher and/or lower levels may be used. Levels 1 and 2 will be referred to as being close to the substrate, for convenience in the claims. Those skilled in the art will appreciate that early detection of flaws in transistor formation is advantageous.

In carrying out a test program according to the invention, a separate mask is used for one or more test chips that uses the transistors that have been fabricated as part of the circuit, not special test transistors. The test mask connects some of the transistors in the circuit to form a test structure.

In some cases, the test structure (containing a subset of transistors in the circuit) may be identical with a portion of the final circuit (a circuit module), as in a situation where a circuit module depends critically on transistor or other parameters in order to work properly. In other cases, where the final circuit uses higher levels of metal, the test structure may achieve the same result using one or two lower levels of metal.

In some other cases, the test structure may be assembled out of transistors used for other purposes—e.g. the circuit contains an assortment of AND circuits, OR circuits, etc (referred to as logic unit circuits), that are connected by the test mask to form a test circuit that is not part of the final design but provides useful information on the quality of the process.

The test process will usually comprise applying a known input (a test vector) to a test subset of transistors and comparing the output with the connect output vector.

In operation, a special mask having the test circuit(s) can be used for a subset of chips on a wafer. Steppers often have storage areas to hold masks used in various levels of wafers or for various wafers. The regular mask for metal level 1, say, would be used for most chips on a wafer and the test mask(s) would be used for those chips that have the test circuits.

Workers in the field known that wafers have "sweet spots" that consistently have higher than average yields of good chips. Conversely, areas that consistently have lower than average yield will be referred to as sensitive locations. Preferably, the location of test arrangements will concentrate on sensitive areas that strongly depend on variations in process parameters. The number and location of test locations will depend on a tradeoff between time spent in testing, lost chips and the benefit in chips saved by more or less closely monitoring the process.

In a typical stepper, a process referred to as step and repeat comprises the steps of moving the stepper to a chip location, exposing the pattern of a chip and repeating the process by moving to the next chip. If the chips are small, the stepper can expose more than one chip at a time.

Figure 4:
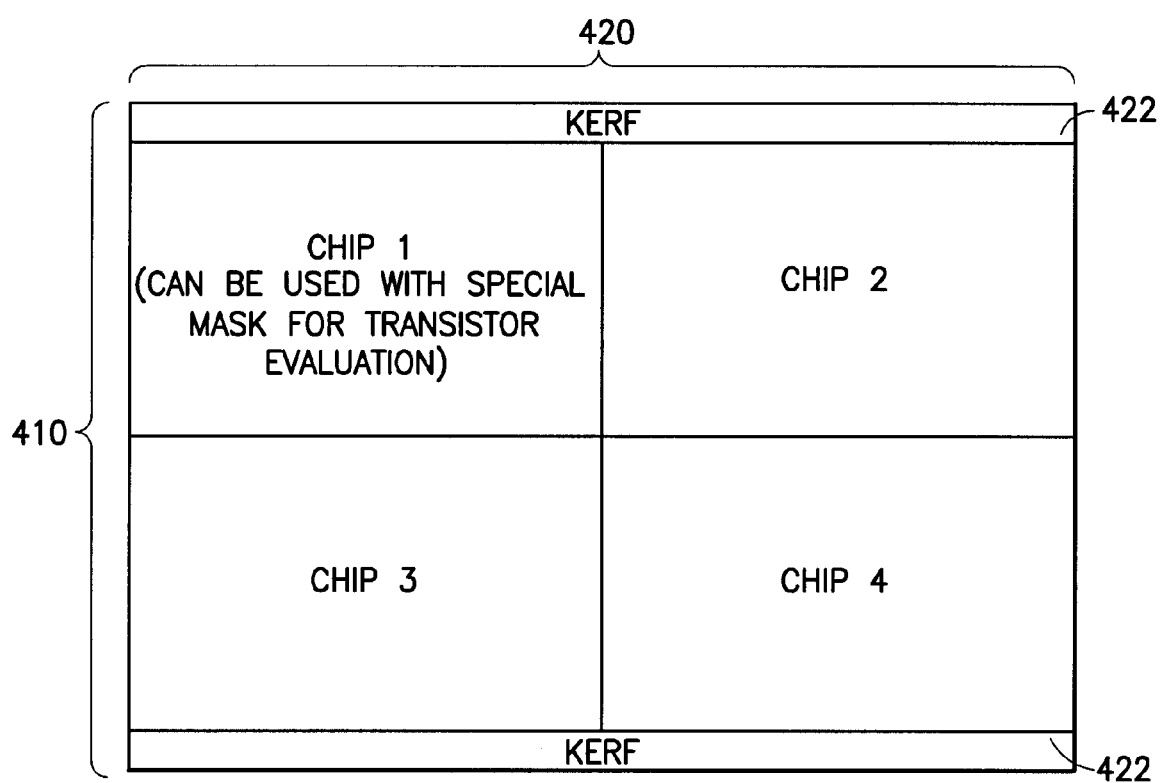
FIG. 4 is a plan view of a test chip and neighboring chips.

FIG. 4 illustrates an example in which brackets 410 and 420 define an area of four chips that are exposed in a single step of the stepper, one of which is a test chip. Two kerf strips 422 are located at the top and bottom of the Figure. In alternative layouts, there may be kerfs between each chip. In this example, the test mask will have the regular layout for chips 2, 3 and 4, with the test layout for chip 1. Those skilled in the art will readily be able to arrange for other test masks for different steppers and chip sizes. If the chips happen to be large, then each chip in FIG. 4 may be a single stepper location.

The ability to evaluate transistors or circuits inside a performance path gives a great advantage in terms of understanding the limiter issue and getting a resolution for a performance problem. The ability to get this information by using a special metal mask(s) enables readout at lower level metal, and minimizes a significant amount of time in the learning and evaluation process. This saving is particularly significant during early product evaluation cycle.

This allows quicker turn-around-time to isolate performance limiters and make proper process changes to resolve the issue. This technique avoids the lengthy time required to do a full product evaluation with each and every new process improvement. It enables a significant amount of statistical data gathering as every chip can be measured. This means earlier and improved correlation to parametric data, which will eventually be used to monitor the process.

Evaluating circuit performance limiters at transistor level using a special wire level mask to gain learning, results in significant time and cost saving. Currently standard end of the process product chip characterization is often followed by chip delayer (stripping off upper layers) and FIB probe to evaluate performance limiter at FET level. This method imposes a significantly higher cost and time consumption compared to the present invention.

The invention does not depend on the type of semiconductor (Silicon, silicon-germanium, gallium arsenide, etc.) or transistor, (bipolar, FET, etc.), type of interconnect (damascene or not, aluminum or copper).

In an alternate mode, the test interconnect layer(s) may be stripped and replaced with the standard pattern of that level, e.g. if the test wiring is on M1, the wafer has the M1 level on that chip stripped and redone. If more convenient, the entire wafer could be stripped of M1 and redone. Whether this alternative is employed will depend on the relative cost of rework and the value of what is salvaged. If the only benefit is salvaging the test chip, rework may not be worthwhile. If experience has shown that rework of the defect revealed by the test can salvage ⅓ or ½ of the chips on the wafer, the decision is more likely to go in favor of rework.

While the invention has been described in terms of a single preferred embodiment, those skilled in the art will recognize that the invention can be practiced in various versions within the spirit and scope of the following claims.

The invention claimed is:

1. A method of testing an integrated circuit structure comprising the steps of:
   providing a semiconductor wafer containing a set of chip locations for forming a set of integrated circuits therein;
   fabricating in said wafer a set of transistors specific to a particular integrated circuit in said chip locations;
   before electrical completion of said integrated circuit, connecting at least one subset of said set of transistors by a lithographic process in at least one chip location in a test interconnect arrangement using interconnect levels close to semiconductor material in said semiconductor wafer;
   testing at least one parameter of said subset of transistors; and
   removing said test interconnect arrangement and depositing an interconnect layer of said integrated circuit in replacement thereof, wherein said test arrangement is constructed using only a first interconnect level above said set of transistors and said test is performed before further interconnect levels are formed.

2. A method according to claim 1, in which said test arrangement is constructed using both a first and second interconnect level above said set of transistors and the test is performed before further interconnect levels are formed.

3. A method according to claim 1, in which said subset is a portion of said integrated circuit.

4. A method according to claim 1, in which said subset is a subcircuit module of said integrated circuit.

5. A method according to claim 1, in which said subset is a subcircuit module of said integrated circuit.

6. A method according to claim 1, in which said subset comprises at least two subcircuit modules of said integrated circuit.

7. A method according to claim 1, in which said test comprises providing an input test vector and recording output signals from said test structure.

8. A method of manufacturing integrated circuits with an integrated circuit process comprising the steps of:
provinding a set of semiconductor wafers containing a set of chip locations for forming a set of integrated circuits therein;
fabricating a set of transistors specific to a particular integrated circuit in said wafers in said chip locations;
before electrical completion of said integrated circuit, connecting at least one subset of said set of transistors by a lithographic process in at least one chip location in a test interconnect arrangement using interconnect levels close to semiconductor material in said semiconductor wafer;
testing at least one parameter of said subset of transistors;
modifying a step in said integrated circuit process when a parameter of said subset of transistors is out of specification; and
removing said test interconnect arrangement and depositing an interconnect layer of said integrated circuit in replacement thereof, wherein said test arrangement is constructed using only a first interconnect level above said set of transistors and said test is performed before further interconnect levels are formed.

9. A method according to claim 8, in which said test arrangement is constructed using both a first and second interconnect level above said set of transistors and the test is performed before further interconnect levels are formed.

* * * * *